United States Patent
Sharma et al.

(10) Patent No.: US 10,411,655 B2
(45) Date of Patent: Sep. 10, 2019

(54) CMOS RF FRONT-END OF TRANSMITTER FOR ROTATIONAL SPECTROSCOPY

(71) Applicant: Board of Regents, The University of Texas System, Austin, TX (US)

(72) Inventors: Navneet Sharma, Richardson, TX (US); Kenneth K. O, Plano, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 203 days.

(21) Appl. No.: 15/628,965

(22) Filed: Jun. 21, 2017

(65) Prior Publication Data
US 2018/0375478 A1 Dec. 27, 2018

(51) Int. Cl.
| | |
|---|---|
| H03F 1/22 | (2006.01) |
| H04B 1/18 | (2006.01) |
| H03D 7/16 | (2006.01) |
| H03H 11/22 | (2006.01) |
| H04B 1/28 | (2006.01) |
| H03D 7/14 | (2006.01) |
| G01J 3/28 | (2006.01) |
| G01J 3/06 | (2006.01) |
| H03F 3/193 | (2006.01) |
| H03F 3/26 | (2006.01) |
| H04B 1/04 | (2006.01) |
| H03L 7/197 | (2006.01) |

(52) U.S. Cl.
CPC ............. *H03F 1/223* (2013.01); *G01J 3/06* (2013.01); *G01J 3/2889* (2013.01); *H03D 7/1441* (2013.01); *H03D 7/1458* (2013.01); *H03D 7/1466* (2013.01); *H03D 7/165* (2013.01); *H03F 3/193* (2013.01); *H03F 3/265* (2013.01); *H03H 11/22* (2013.01); *H04B 1/0475* (2013.01); *H04B 1/18* (2013.01); *H04B 1/28* (2013.01); *H03F 2200/405* (2013.01); *H03F 2200/451* (2013.01); *H03F 2200/534* (2013.01); *H03F 2200/537* (2013.01); *H03F 2200/541* (2013.01); *H03L 7/1974* (2013.01)

(58) Field of Classification Search
CPC . H03F 3/195; H03F 3/245; H03F 3/24; H03F 1/0216; H03F 1/223; H03F 1/02; H03F 1/025; H03F 1/56
USPC .............. 375/219, 295, 346; 455/118, 63.4
See application file for complete search history.

(56) References Cited

U.S. PATENT DOCUMENTS

2003/0098806 A1* 5/2003 Green ................ H03D 7/16
341/144

OTHER PUBLICATIONS

E. Ojefors, et al., "Active 220- and 325-GHz Frequency Multiplier Chains in an SiGe HBT Technology," IEEE Transactions on Microwave Theory and Techniques, May 2011, pp. 1311-1318, vol. 59, No. 5.

(Continued)

*Primary Examiner* — John W Poos
(74) *Attorney, Agent, or Firm* — Schott, P.C.

(57) ABSTRACT

A radio frequency (RF) front-end for a transmitter in a complementary metal-oxide-semiconductor (CMOS) includes a mixer based core that itself includes first and second input signals; an amplifier that amplifies the first signal and transmits a corresponding amplified first signal; an up-conversion mixer that receives the amplified first signal and the second signal through transistors, and mixes the amplified first signal and second signal and generates a radio frequency (RF) signal; and an antenna that receives the RF signal and transmits the signal from the front-end.

18 Claims, 7 Drawing Sheets

(56) References Cited

OTHER PUBLICATIONS

H. Lin, G. Rebeiz, "A 200-245 GHz Balanced Frequency Doubler with Peak Output Power of +2 dBm," CSICS, Oct. 2013, pp. 1-4, San Diego, CA.
K. Schmalz, et al., "245 GHz SiGe Transmitter with Integrated Antenna and External PLL," Microwave Symposium Digest, Jun. 2013, pp. 1-3.
N. Sharma, et al., "160-310 GHz Frequency Doubler in 65-nm CMOS with 3-dBm Peak Output Power for Rotational Spectroscopy," Radio Frequency Integrated Circuts Symposium, Jul. 2016, pp. 186-189.
N. Sarmah, et al, "235-275 GHz (×16) Frequency Multiplier Chains with up to 0 dBm Peak Output Power and Low DC Power Consumption," Radio Frequency Integrated Circuits Symposium, 2014, pp. 181-184.
N. Sharma, et al., "85-to-127 GHz CMOS Transmitter for Rotational Spectroscopy," Custom Integrated Circuits Conference, 2014, pp. 298-301.
O. Momeni, E. Afshari, "A Broadband mm-Wave and Terahertz Traveling-Wave Frequency Multiplieron CMOS," IEEE Journal of Solid-State Circuits, Dec. 2011, pp. 2966-2976, vol. 46, No. 12.
Q. Zhong, et al., "225-280 GHz Receiver for Rotational Spectroscopy," Radio Frequency Integrated Circuits Symposium, 2016, pp. 298-301.
W.L. Chan and J.R. Long, "A 58-65 GHz Neutralized CMOS Power Amplifier With PAE Above 10% at 1-V Supply," IEEE Journal of Solid-State Circuits, Mar. 2010, pp. 554-564, vol. 45, Issue: 3.
Z. Wang, et al., "A CMOS 210-GHz Fundamental Transceiver With OOK Modulation," IEEE Journal of Solid-State Circuits, Mar. 2014, pp. 564-580, vol. 49, No. 3.
Medvedev, et al., "Submillimeter spectroscopy for chemical analysis with absolute specificity," Optics Letters, May 2010, pp. 1533-1535, vol. 35, No. 10.
Virginia Diodes, "Integrated AMC-VDI Model: WR3.4AMC-I," VDI, Last accessed: Jun. 2017, http://vadiodes.com/index.php/en/products/compact-transmitter-modules-amc-i?id=747.

* cited by examiner

CMOS RF FRONT-END OF TRANSMITTER FOR ROTATIONAL SPECTROSCOPY

BACKGROUND

Portable gas spectroscopy may be useful in settings that include indoor or confined space air monitoring and breath analysis. Current technologies include either small devices that detect a limited number of gas types (such as for common roadside alcohol breathalyzer tests) or may lack sensitivity. Larger devices may be able to scan for a broader number of gas types, but their size and power consumption may make them undesirable in many environments.

Figure 1A:
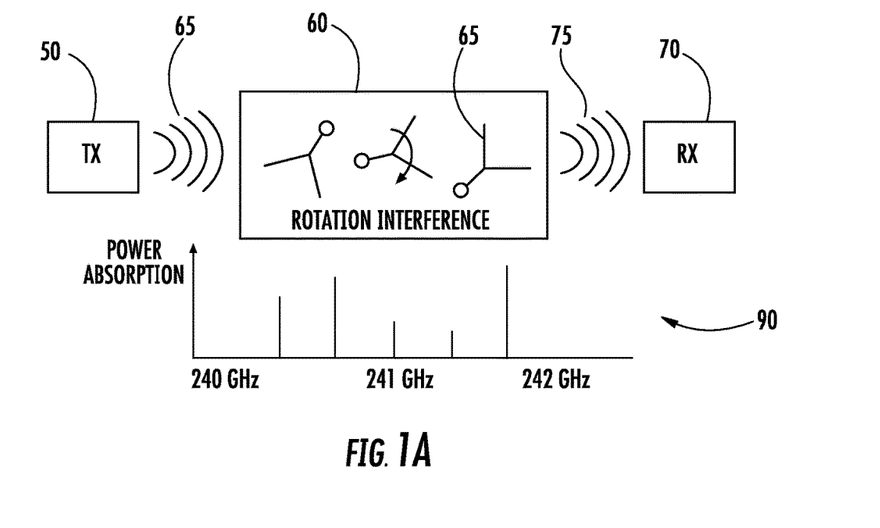
FIG. 1A shows a graphical representation of radio spectroscopy.

As an overview of the technology, electro-magnetic waves in the millimeter and submillimeter wave frequency ranges can be used for fast scan rotational spectroscopy to detect gas molecules and measure their concentrations. As an overview of how rotational spectroscopy works and as shown in FIG. 1A, a transmitter 50 such as a VDI transmitter (using components from Virginia Diode Inc, manufacture of high frequency GaAs devices) radiates electromagnetic waves 55 within a certain frequency range into an absorption cell 60 containing gas molecules 65. The waves change the rotational state of gas molecules and a part of the wave power is lost in this interaction. This results in a drop of power picked up 75 at a receiver (RX) 70 such as a VDI receiver or a spike. By sweeping the transmitter (TX) 50 output frequency, a sweep controlled by a computer (not shown), the receiver 70 may measure the frequency response of the absorption cell 60. As shown in the frequency vs power absorption graph 90, looking at the frequencies at which the waves are absorbed and the depth of absorption line, the presence of a particular molecule and its concentration may be determined.

Rotational spectrometers use a frequency multiplier chain driven from a signal generated using a synthesizer to generate the transmitter signal, and a diode based sub-harmonic mixer followed by an amplifier and a diode amplitude detector to measure the received signal amplitude. The frequency multiplier chain, mixer and diode may be fabricated using compound-semiconductor technologies. Rotational spectroscopy at 240-250 GHz has been demonstrated using SiGe heterojunction bipolar transistor (HBT) based radio frequency (RF) front-ends for transmission and reception and a spectrometer that measures 200-300 GHz frequency waves uses III-V technology (obtained by combining group III elements (Al, Ga, In) with group V elements (N, P, As, Sb)) but is both expensive and bulky.

In use in a wideband transmission/detection scenario, a transmitter for the spectrometer may generate an FM signal that can be scanned over ~100-GHz frequency range with a 10-kHz step. The transmitted power level may be −30 to −10 dBm to avoid the saturation of gas molecules in a sample.

Figure 1B:
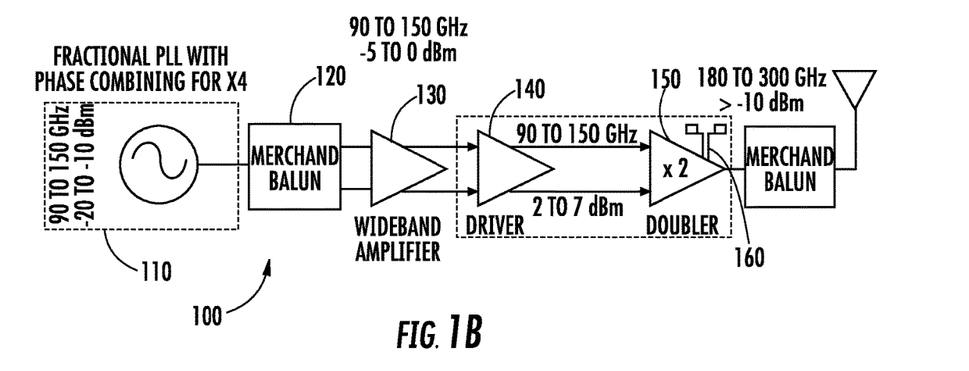
FIG. 1B shows a schematic of the doubler based transmitter design.

FIG. 1B shows one such doubler-based transmitter 100. The doubler based transmitter includes a fractional phase locked loop (PLL) 110 that generates a 90 to 150 GHz signal with −20 to −10 dBm transmitted power level. A Marchand Balun 120 received this PLL signal and generates a differential signal that the wideband amplifier 130 transmits to the driver 140 that transmits the 90-150 GHz signal to the doubler 150, which outputs the signal as a 180 to 300 GHz signal with a >−10 dBm power level.

Figure 3:
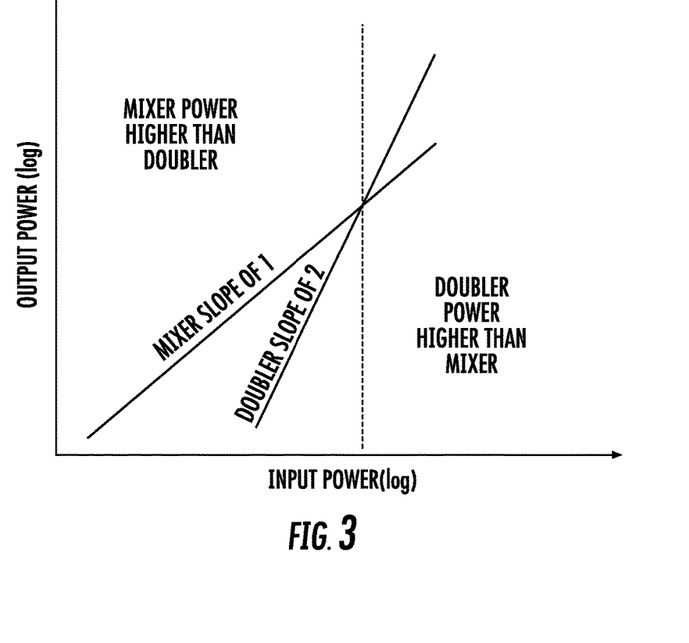
FIG. 3 shows a graph of input power vs output power of the transmitter.

This achieves the target frequency range, but at a cost. As shown in FIG. 3, which is a conceptual diagram depicting output power vs input power response for mixer and doubler based systems, for a moderate output power requirement, the input power required for the doubler based design requires a higher output than the mixer design (to be introduced hereafter). Also, the doubler based system generates twice the frequency of input signal. If the input signal is not able to cover the complete frequency range, the output will not be continuous. The wideband PLL at high frequency especially the one using magnetic switching may be prone to frequency gaps in their operating range.

SUMMARY OF THE EMBODIMENTS

A radio frequency (RF) front-end for a transmitter in a complementary metal-oxide-semiconductor (CMOS) includes a mixer based core that itself includes first and second input signals; an amplifier that amplifies the first signal and transmits a corresponding amplified first signal; an up-conversion mixer that receives the amplified first signal and the second signal through transistors, and mixes the amplified first signal and second signal and generates a radio frequency (RF) signal; and an antenna that receives the RF signal and transmits the signal from the front-end.

DETAILED DESCRIPTION OF THE EMBODIMENTS

Introduction

A 200-280 GHz radio frequency (RF) front-end of transmitter may be constructed in 65-nm a complementary metal-oxide-semiconductor (CMOS). In this transmitter, saturated equivalent isotropically radiated power (EIRP) has been shown in experiments to have greater than −5 dBm over a frequency range of 60 GHz. When the input power is −20 dBm, EIRP is greater than −10 dBm for most of the frequency range, and achieves 3-dB and 6-dB bandwidths of 24% and 33%. The front-end may be integrated with a fractional-N synthesizer to form a transmitter operating at 208-255 GHz with EIRP of −18 to −11 dBm. The transmitter and a CMOS receiver may be used for rotational spectroscopy and to detect ethanol in human breath.

Figure 2:
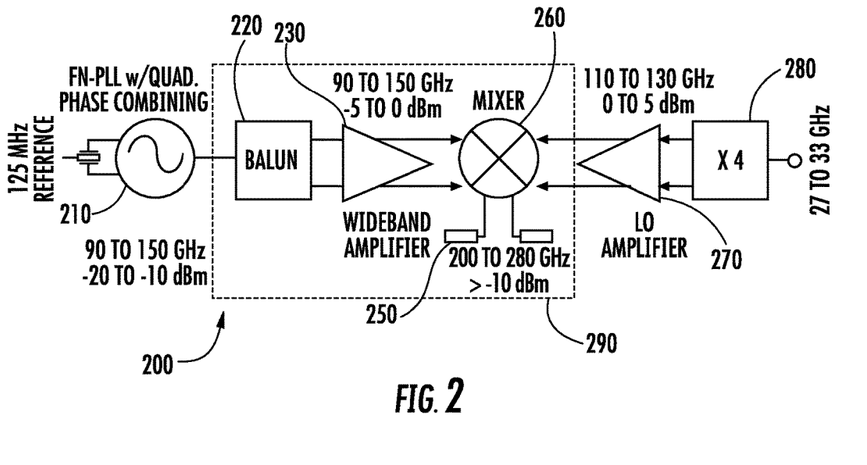
FIG. 2 shows a schematic of the mixer-based transmitter design.
Figure 4:
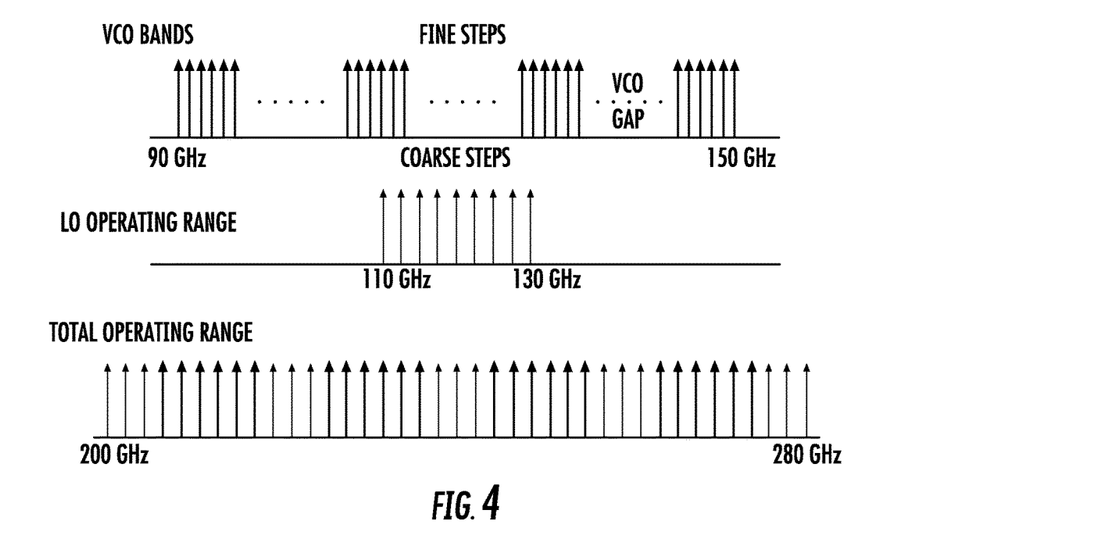
FIG. 4 shows a schematic diagram of RF=LO+IF, to show a total operating range of the RF signal.

As shown in an overview in FIG. 2, the 200-280 GHz RF front-end transmitter 200 described herein includes a mixer based core 290 comprising a wideband amplifier 230, an up-conversion mixer 260, and an on-chip dipole antenna 250, wherein the core amplifies and mixes an input signal of a first frequency of 90 (x)-150 (x') GHz and a local oscillator (LO) amplifier 270's signal of a second frequency of 110 (y)-130 (y') GHz to generate the RF signal with the desired bandwidth. Use of an up-conversion mixer 260 instead of a frequency doubler from the doubler based system 100 lowers the broadband high input power requirement, and results in the input/output power requirement improvement shown in FIG. 3. In comparison to the doubler based system 100, the mixer based system 200 may receive an extra LO signal, which may require additional PLL and amplifiers that increase the power consumption and area. Further, in a rotational spectrometer, the output RF signal scans an entire range with a small step of 10 kHz. In the mixer system 200, the IF and LO signals may be independently scanned in frequency to generate a desired output frequency scan pattern, using coarse and fine steps split between IF and LO signals. With RF=IF+LO, as shown in FIG. 4, IF signals can be used for small frequency steps while large steps can be taken using LO signals. This may simplify searching for a given gas molecule as LO can be programmed to jump from one line to other and IF can be used to scan around the line.

The IF signal can be controlled by the a PLL 210 that receives a reference signal of 125 MHz with a fine frequency step that sends a 90 to 150 GHz signal of −20 to −10 dBm power level to the Marchand Balun 220. The Marchand Balun 220 converts the single ended PLL output signal to a differential signal required for the wideband amplifier 230, which sends the 90 to 150 GHz signal of −5 to 0 dBm power level to the mixer 260. (A differential topology may enable the use of neutralization and transformers avoiding coupling capacitors.)

The 110 to 130 GHz LO signal of power level 0 to 5 dBm may be generated by an LO amplifier 270, which is fed by a multiplier 280 fed by a 27 to 33 GHz input signal. The LO signal is transmitted to the mixer 260, which mixes the IF and LO signal to generate a 200-280 GHz signal at a >−10 dBm power level for transmission from the dipole antenna 250.

The LO signal can be used for coarse stepping of one gigahertz or higher. LO sweeping techniques may also be used for filling up the frequency gaps, typically present in broadband VCO's. A broadband VCO can be designed using non-contiguous frequency bands and hence can have a wider output frequency range.

Amplifier Design Details

Figure 5A:
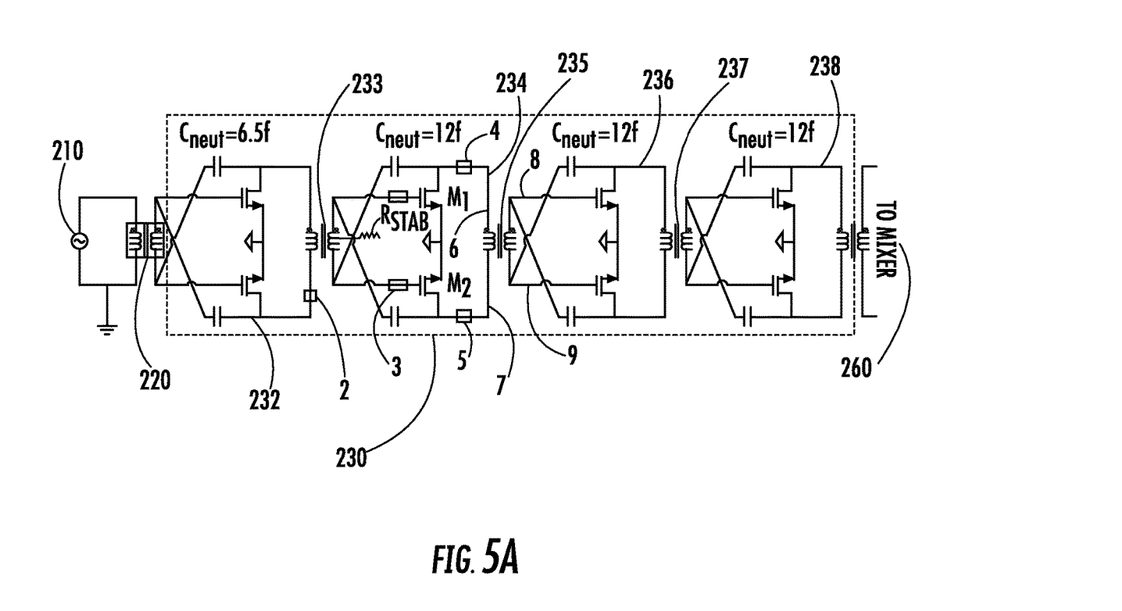
FIG. 5A shows a schematic of an amplifier circuit.

FIG. 5A shows a schematic of the four stage IF amplifier 230 including the PLL 210, Marchand Balun 220, and mixer 260. The input from the PLL 210 may be from ~90 to 150 GHz as mentioned above and may be designed in a UMC 65-nm CMOS process. To compensate for the low power from a broadband synthesizer and conversion loss expected from an up-converting mixer, a 4-stage stagger tuned amplifier 230 may be inserted before the IF input port of the mixer 260. The four stage amplifiers 232, 234, 236, and 238 may be tuned to different frequencies as required, and separated by 1:1 twin transformers 233, 235, 237.

To increase the gain and to take advantage of the differential topology, Miller neutralization may be used in the stage amplifiers 232, 234, 236, and 238. This neutralization reduces the effects of gate capacitance (Cgd) on each stage amplifier 232, 234, 236, and 238 and hence helps to make each transistor more unilateral, where using the design of each stage amplifier, the effective capacitance (Ceff)=Cgd−the neutralization capacitance (Cneut).

Figure 5B:
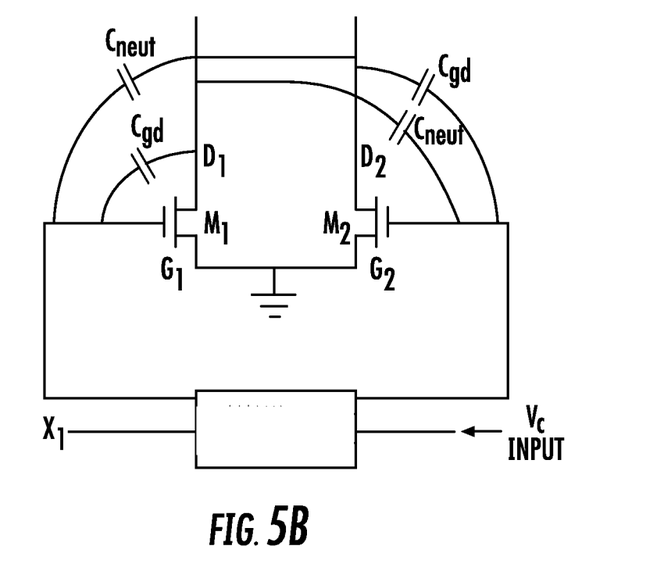
FIGS. 5B and 5C show schematic diagrams for an amplifier.
Figure 5C:
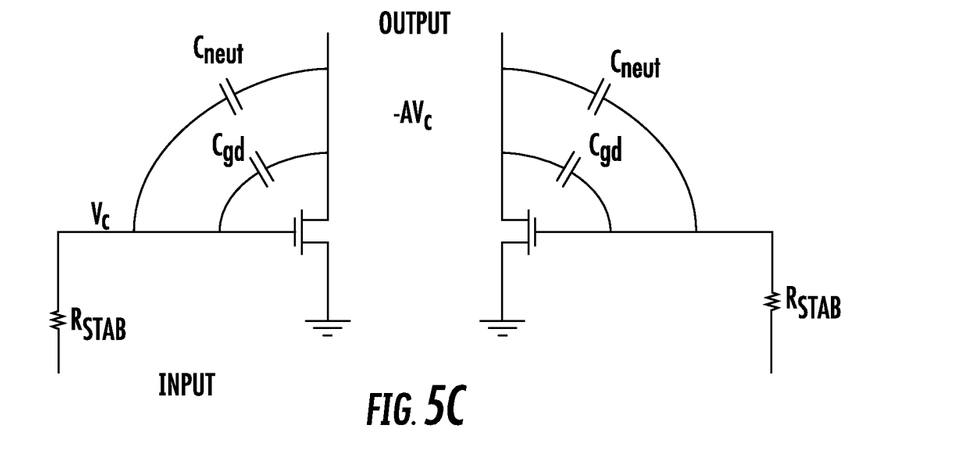

This neutralized amplifier may be explained in more detail by FIGS. 5B and 5C. FIG. 5B shows a single neutralized amplifier stage. When operating with a common mode signal, G1 and G2 see the same signal Vc and D1 and D2 see −AVc where −A is the common mode gain of the stage amplifier.

The circuit from FIG. 5B can be redrawn as shown in FIG. 5C. As can be seen, the neutralization capacitor Cneut, which was used to cancel the effect of Cgd, now shows up in parallel to Cgd. The effective capacitance Ceff between the gate and drain is Cgd+Cneut. Since Ceff increases the feedback between the gate and drain (input and output) it may decrease the amplifier's stability. To suppress these common mode oscillations, a stabilizing resistor Rstab may be added to the center tap of the transformer X1.

FIG. 5A, and in particular the second stage amplifier 234, shows details of a single stage amplifier with an understanding that the other stage amplifiers may be the same. In each successive amplifier, an input signal from the previous stage amplifier is impedance matched to the transistor M1-2 by using the transformer 233 and transmission lines 2 and 3. The amplified signal appears at the drain of the transistors M1 and M2 at terminals 4 and 5. The drain of transistors at terminals 4 and 5 is used to match the next stage amplifier 236 using transmission lines 6 to 9 (similarly 7 to 8) and transformer 235. As discussed previously, Cneut is used to cancel Cgd and achieve higher gain, and this four stage amplifier and interstage matching is adjusted to achieve high gain at each frequency point.

Figure 6A:
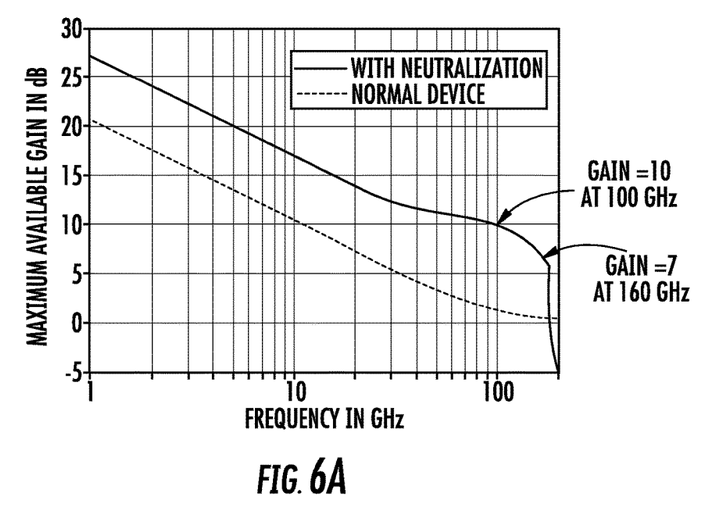
FIGS. 6A and 6B show frequency vs available gain and frequency vs S-Parameters graphical data, respectively.

The amplifier 230 gain may be optimized to peak at higher frequencies to compensate for PLL power roll-off at higher frequencies. It was observed in simulations that an amplification stage tuned at higher frequencies decreases the gain at lower frequencies by about 10 dB while gaining only 2-3 dB at the higher end. The gain of intrinsic device rolls off from DC until it reaches fmax, hence an ideal frequency response of gain for an amplifier optimized for the highest gain will follow this curve, which can be seen in FIG. 6A, where the gain at 100 GHz is 10 dB while the gain at 160 GHz is near 7 dB.

Figure 6B:
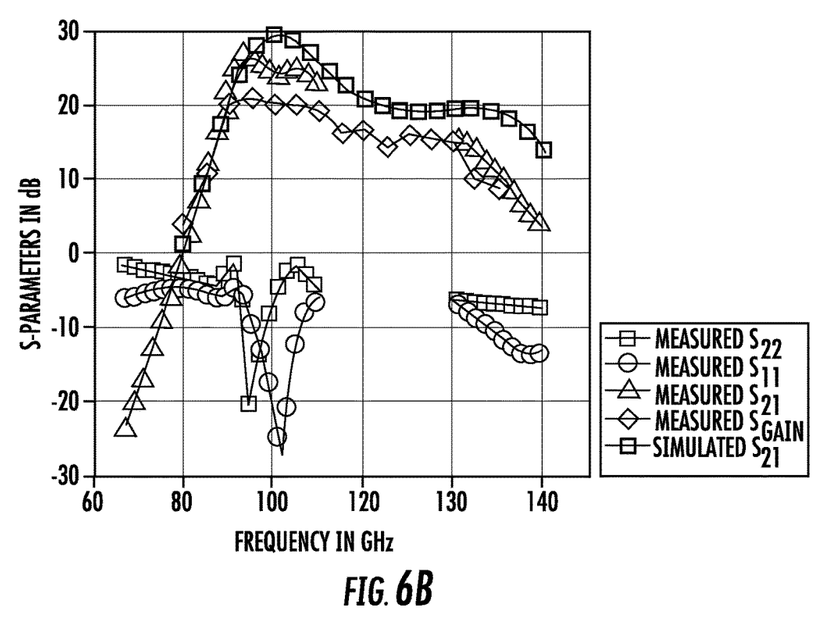

The matching of the four-stage staggered tuned amplifier 230 may be optimized to have a similar drop from 40 dB (4×10 dB) at 100 GHz to 28 dB (4×7 dB) at 160 GHz. This may further increase the frequency dependence of transmitter output. Also, the optimum matching condition may change with frequency due to the self-resonant frequencies of passive devices. For a spectroscopy application, frequency dependence of the transmitter output may not be an issue as frequency modulation of the transmitter output may immunize it from the power variation, hence there may be a need to generate maximum possible power at each frequency point. FIG. 6B provides such an amplifier result and depicts the slope discussed earlier.

The neutralization technique above may improve the differential stability of the amplifier 230 as the feedback capacitor is effectively reduced. The resistance added to drain may reduce the effective VDS seen by the device, and therefore a common mode resistance of 90 Ohm may be added in series at the gate.

The neutralization capacitor used to cancel Cgd of the transistor may designed using a top-to-bottom metal routing for lower resistive losses. The transformers may use a turning ratio of −1 to keep the self-resonant frequency higher than the operating frequency. Differential transmission lines may also be used for inter-stage matching. This also increases the bandwidth of match as it effectively folds the impedance response of the following stage on a Smith chart. The amplifier simulation results achieved 20-dB gain from the single ended input to the differential output.

Mixer Design Details

Figure 7:
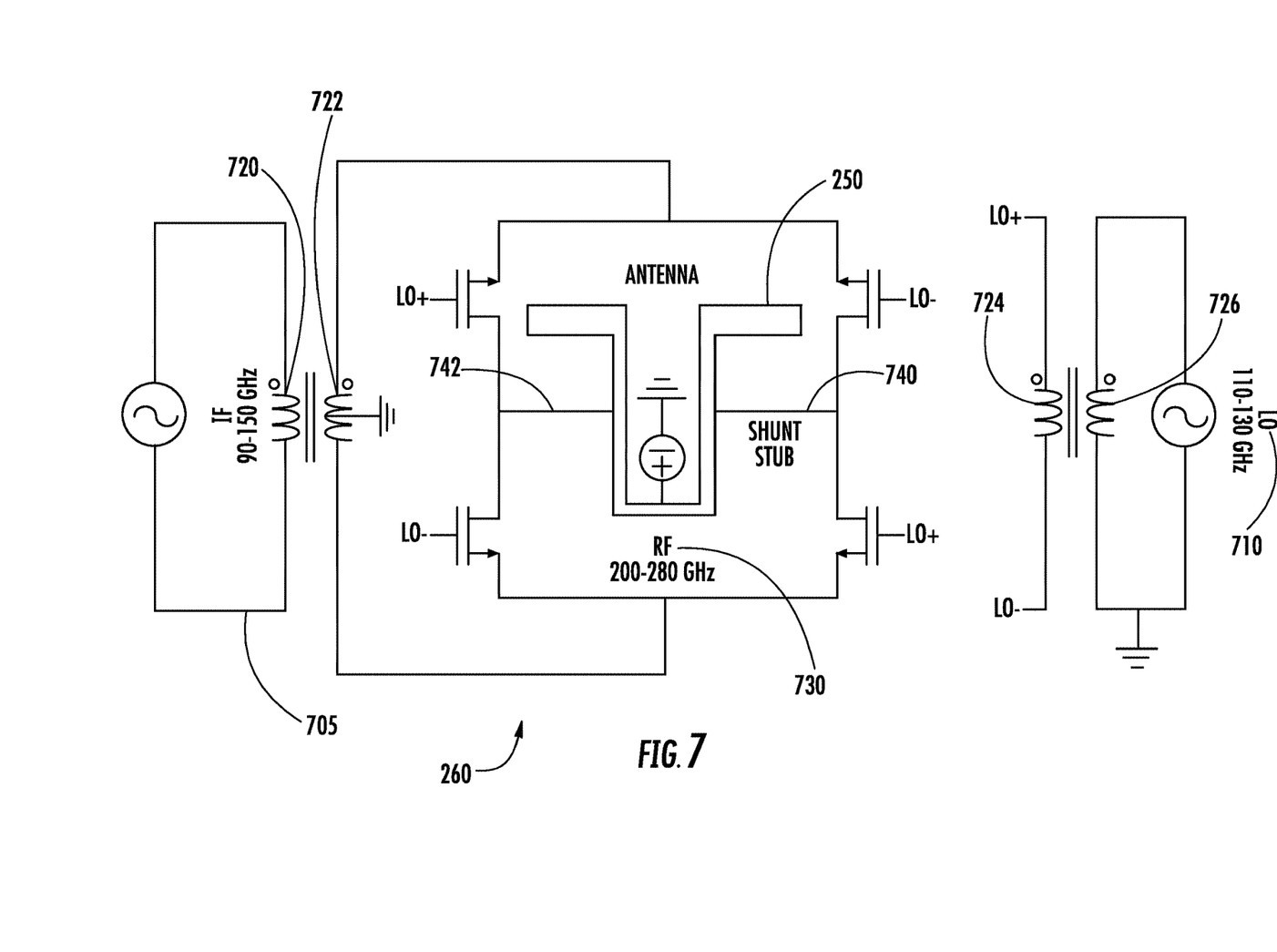
FIG. 7 shows a schematic of a mixer
Figure 8A:
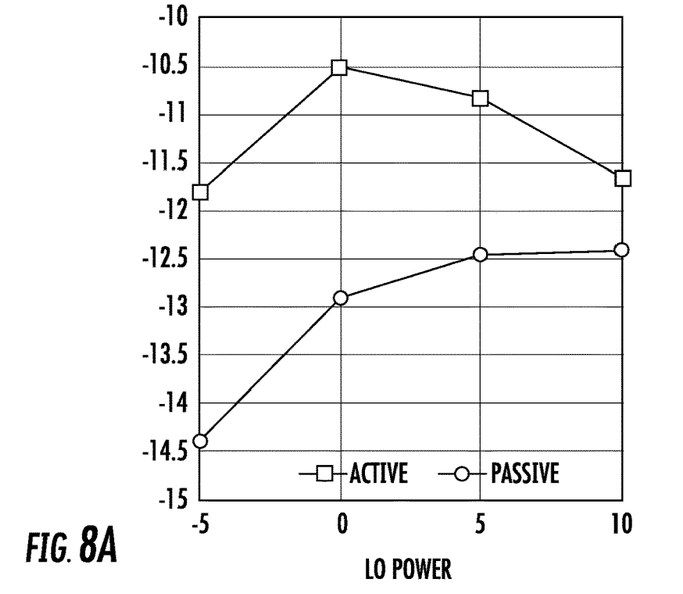
FIGS. 8A and 8B show experimental results of conversion gain of mixer plotted vs. LO power at 120 GHz and (b) vs. intermediate frequency (IF) for both active and passive operation.
Figure 8B:
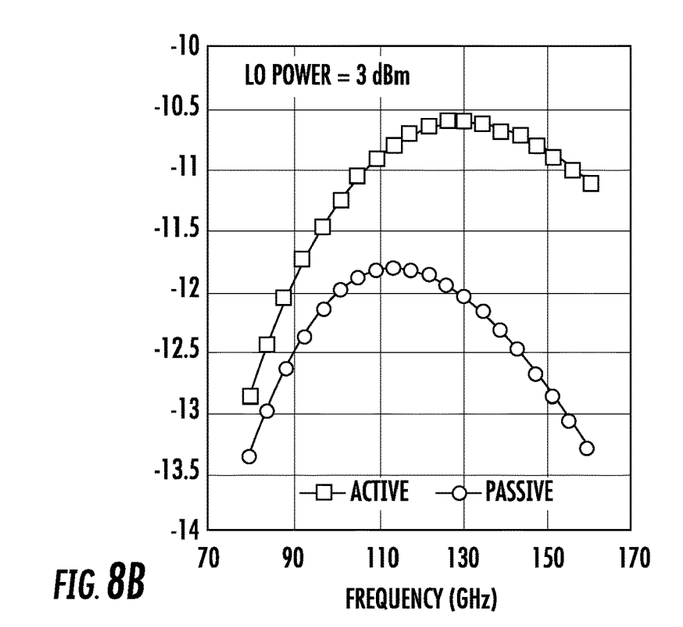

FIG. 7 shows the mixer 260 schematic that uses a fully balanced structure with a differential RF port driving the on-chip dipole antenna 250. The amplifier IF output 705 and LO input 710 may be coupled to the mixer 260 using transformers 720, 722, 724, 726. The RF port 730 may be matched with a shunt stub 740, 742 created by extending the antenna feedline leading to a symmetrical structure as shown in the layout. The layout is designed for symmetry along the two of the three ports resulting in high isolation between the two ports. The mixer can be operated in active and passive mode depending on the DC bias at the shunt stubs of the RF port. As shown in FIGS. 8A and 8B, which show experimental results of conversion gain of mixer plotted vs. LO power at 120 GHz and (b) vs. intermediate frequency (IF) for both active and passive operation, an active mixer exhibits higher gain in simulations while requiring lower LO power.

The simulated conversion gain of the mixer itself in the active mode (single ended input to differential output) with 3-dBm LO power may be −8 dB. The mixer may be tuned for higher conversion gain at higher frequencies to compensate for the lower gain of IF amplifier at higher frequencies leading to a flatter frequency response. The dipole antenna, transformers and differential transmission lines may be constructed using the ~3-μm thick top copper layer (M10).

While the invention has been described with reference to the embodiments above, a person of ordinary skill in the art would understand that various changes or modifications may be made thereto without departing from the scope of the claims.

We claim:

1. A radio frequency (RF) front-end for a transmitter in a complementary metal-oxide-semiconductor (CMOS) comprising a mixer based core comprising:
   first and second input signals;
   an amplifier that amplifies the first signal and transmits a corresponding amplified first signal;
   an up-conversion mixer that receives the amplified first signal and the second signal through transistors, and mixes the amplified first signal and second signal and generates a radio frequency (RF) signal; and
   an antenna that receives the RF signal and transmits the signal from the front-end;
   wherein the first signal has a frequency of between x and x' GHz and the second signal has a frequency of y to y' GHz, where x, x' y, and y' are numbers corresponding to frequencies, and the RF signal generated by the up-conversion mixer has a frequency of between (x+y) and (x'+y') GHz in steps of between 10 kHz.

2. The RF front end of claim 1, wherein x is 90 GHz and x' is 150 GHz.

3. The RF front end of claim 2, wherein y is 110 GHz and y' is 130 GHz.

4. The RF front end of claim 1, wherein the first signal is an intermediate frequency (IF) signal.

5. The RF front end of claim 4, wherein the second signal is a local oscillator (LO) signal.

6. A radio frequency (RF) front-end for a transmitter in a complementary metal-oxide-semiconductor (CMOS) comprising a mixer based core comprising:
   first and second input signals;
   an amplifier that amplifies the first signal and transmits a corresponding amplified first signal;
   an up-conversion mixer that receives the amplified first signal and the second signal through transistors, and mixes the amplified first signal and second signal and generates a radio frequency (RF) signal; and
   an antenna that receives the RF signal and transmits the signal from the front-end;
   wherein the first signal is an intermediate frequency (IF) signal,
   wherein the second signal is a local oscillator (LO) signal,
   wherein the IF and LO signals are independently scanned in frequency to generate a desired output frequency for the RF signal, using coarse and fine steps split between IF signal and LO signal.

7. A radio frequency (RF) front-end for a transmitter in a complementary metal-oxide-semiconductor (CMOS) comprising a mixer based core comprising:
   first and second input signals;
   an amplifier that amplifies the first signal and transmits a corresponding amplified first signal;
   an up-conversion mixer that receives the amplified first signal and the second signal through transistors, and mixes the amplified first signal and second signal and generates a radio frequency (RF) signal; and
   an antenna that receives the RF signal and transmits the signal from the front-end;
   wherein the first signal is generated by a single-ended phase locked loop (PLL).

8. The RF front end of claim 7, wherein the PLL receives a reference signal.

9. The RF front end of claim 7, wherein the second signal is transmitted from a local oscillator (LO) amplifier that receives an input signal.

10. The RF front end of claim 9, wherein the input signal is multiplied by a 4× multiplier before transmission to the up-conversion mixer.

11. The RF front end of claim 7, further comprising a Marchund Balun that converts a received signal into the first signal, wherein the first signal is a differential signal.

12. The RF front end of claim 7, wherein the amplifier is a wideband amplifier that is a multi-stage amplifier comprising one amplifier per stage.

13. The RF front end of claim 12, wherein each amplifier is separated from an adjacent amplifier by a transformer.

14. The RF front end of claim 13, wherein the number of stages is four.

15. The RF front end of claim 13, wherein the transformers are 1:1 twin transformers.

16. The RF front end of claim 12, wherein each amplifier is a neutralized amplifier where a neutralized capacitance offsets a gate to drain capacitance.

17. A rotational spectrometer including a complementary metal-oxide-semiconductor (CMOS) comprising a mixer based core comprising:
   first and second input signals;
   an amplifier that amplifies the first signal and transmits a corresponding amplified first signal;
   an up-conversion mixer that receives the amplified first signal and the second signal through transistors, and mixes the amplified first signal and second signal and generates a radio frequency (RF) signal; and
   an antenna that receives the RF signal and transmits the signal from CMOS;
   wherein the first signal has a frequency of between x and x' GHz and the second signal has a frequency of y to y' GHz, where x, x' y, and y' are numbers corresponding to frequencies, and the RF signal generated by the up-conversion mixer has a frequency of between (x+y) and (x'+y') GHz in steps of 10 kHz.

18. The rotational spectrometer of claim 17, wherein x is 90 GHz and x' is 150 GHz and wherein y is 110 GHz and y' is 130 GHz.

\* \* \* \* \*